United States Patent [19]
Tanibe

[11] Patent Number: 4,736,266
[45] Date of Patent: Apr. 5, 1988

[54] PRINTED CIRCUIT BOARD AND A CIRCUIT ASSEMBLY FOR A RADIO APPARATUS

[75] Inventor: Norio Tanibe, Sagamihara, Japan

[73] Assignee: Fujitsu Limited, Kawasaki, Japan

[21] Appl. No.: 737,077

[22] Filed: May 23, 1985

[30] Foreign Application Priority Data

May 25, 1984 [JP] Japan .................. 59-104768

[51] Int. Cl.⁴ .................. H05K 9/00; H05K 1/11; H05K 1/14
[52] U.S. Cl. .................. 361/424; 361/414
[58] Field of Search .................. 361/414, 413, 424

[56] References Cited

U.S. PATENT DOCUMENTS

| Re. 27,089 | 3/1971 | Sears et al. | 361/414 |
|---|---|---|---|
| 3,346,773 | 10/1967 | Lomerson | 361/414 X |
| 3,459,998 | 8/1969 | Focarile | 361/413 X |
| 3,509,624 | 5/1970 | Boncher | 361/414 X |
| 3,568,001 | 3/1971 | Straus | 361/413 |
| 4,339,628 | 7/1982 | Marcantonio et al. | 361/424 X |
| 4,386,388 | 5/1983 | Beun | 361/424 X |
| 4,477,862 | 10/1984 | Gunzales | 361/413 X |
| 4,514,784 | 4/1985 | Williams et al. | 361/413 X |

FOREIGN PATENT DOCUMENTS 1248114  8/1967  Fed. Rep. of Germany ...... 361/414

OTHER PUBLICATIONS

Higgins, P. H. and Shabe, J. E., "Module Socket Pins with Insulating Sleeves", *IBM Technical Disclosure Bulletin*, vol. 22, No. 7, Dec. 1979.

Kin, Y. I., "Pin Attachment Structure for Multilayer Ceramic Substrates", *IBM Technical Disclosure Bulletin*, vol. 20, No. 11A, Apr. 1978.

*Primary Examiner*—James Kee Chi
*Attorney, Agent, or Firm*—Staas & Halsey

[57] ABSTRACT

A printed circuit board comprises a baseboard having conductor patterns therein and ground layers on both surfaces thereof, and terminal pins mounted on the baseboard. The terminal pins have a root portion which does not project from the baseboard and a contact portion which projects from the baseboard. A circuit assembly comprises a mother printed circuit board, such as the above-mentioned printed circuit board, on which circuit modules are mounted. The circuit module has terminal jacks, which are enclosed within a shielded package and into which the terminal pins of the mother printed circuit board are connected by insertion.

8 Claims, 4 Drawing Sheets

PRINTED CIRCUIT BOARD AND A CIRCUIT ASSEMBLY FOR A RADIO APPARATUS

BACKGROUND OF THE INVENTION

1. Field of the Invention

The present invention relates, in general, to a radio apparatus and, in particular, to a circuit mounting structure of the same. More specifically, the present invention relates to a printed circuit board (PC board) and a circuit assembly for a radio apparatus, which PC board and assembly are particularly advantageous for use in mobile radio communication units, such as citizen band transceivers, mobile telephones, or portable telephones.

2. Description of the Related Art

The above-mentioned types of radio communication units are required to have a compact structure and high performance characteristics. In particular, for a portable telephone, a receiver, a transmitter, a controller, and a power source must be assembled into a single unit having a handy or pocket size structure. Accordingly, the mounting of the electrical components or circuits thereof in a high density is an important problem.

Further, in a radio apparatus, the electromagnetic shield of a radio frequency (RF) circuit is also a very important problem. This problem becomes greater as the mounting density of the electrical components or circuits becomes higher and the radio frequencies increase.

According to a conventional mounting structure, an RF circuit consists of a plurality of modules having predetermined functions. A conventional RF circuit module has a modular circuit assembly including a PC board of dielectric material having conductor patterns, and electrical components and terminal pins are mounted thereon in electrical connection with the conductor patterns. This modular circuit assembly is mounted in a metal shielded package for electromagnetic shielding, with the terminal pins projecting out of the shielded package.

The RF circuit modules are mounted on a mother PC board of dielectric material having conductor patterns. In a conventional mounting structure, the terminal pins of the RF circuit modules are inserted into plated throughholes in the mother PC board, in such a manner that the ends of the terminal pins project beyond the back surface of the mother PC board, i.e., the surface opposite to the circuit module mounting surface, and are soldered to the conductor patterns on the back surface of the mother PC board. In many cases, the mother PC board has a ground layer on the circuit module mounting surface thereof, to which the circuit modules are electrically grounded.

In another conventional mounting structure, the mother PC board is provided with terminal jacks, into which the terminal pins of the RF circuit modules are connected, to facilitate the connection and disconnection of the RF modules. In this case, also, the terminal jacks are mounted on the mother PC board, and the ends thereof project beyond the back surface of the mother PC board and are soldered to the conductor on the back surface of the mother PC board.

That is, in the above-mentioned mounting structures, the terminal pins or jacks have projections exposed on the backside of the mother PC board. This structure has a problem in that the exposed projections of the terminal pins or jacks cause undesirable electromagnetic interference between the RF circuit modules to be produced. Further, the projections of the terminal pins or jacks cause dead spaces to be produced, from the viewpoint of the mounting structure, thereby obstructing the achievement of a high density mounting. Furthermore, there is a disadvantage in that handling of the RF circuit module with the terminal pins projecting therefrom is inconvenient during the manufacturing and mounting steps. For example, the terminal pins are apt to be damaged at this point.

SUMMARY OF THE INVENTION

It is an object of the present invention to provide a new and improved circuit mounting structure for a radio apparatus.

Another object of the present invention is to provide a new and improved structure of a PC board for a radio apparatus, which is particularly advantageous for use in the above-mentioned types of mobile radio communication units.

A further object of the present invention is to provide a new and improved structure of a circuit assembly for a radio apparatus, which is particularly advantageous for use in the above-mentioned types of mobile radio communication units.

According to the present invention, there is provided a PC board for a radio apparatus, comprising a baseboard and terminal pins fixedly mounted on the baseboard. The baseboard is made of dielectric material with inner conductor patterns therein and ground layers on both surfaces thereof. The terminal pins are in electrical connection with the inner conductor patterns of the baseboard. Each of the terminal pins has a root portion fixed to the baseboard without projecting from the baseboard and a contact portion perpendicularly projecting from the baseboard.

According to the present invention, there is also provided a circuit assembly for a radio apparatus, comprising a mother PC board and circuit modules mounted on the mother PC board. The mother PC board comprises a baseboard and terminal pins fixedly mounted on the baseboard. The baseboard is made of dielectric material with inner conductor patterns therein and ground layers on both surfaces thereof. The terminal pins are in electrical connection with the inner conductor patterns of the baseboard. Each of the terminal pins has a root portion fixed to the baseboard without projecting from the baseboard and a contact portion perpendicularly projecting from the baseboard. Each of the circuit modules comprises a module circuit assembly and a shielded package enclosing the module circuit assembly, for electromagnetic shielding. The modular circuit assembly comprises a module PC board of dielectric material with conductor patterns, electrical components mounted on the module PC board in electrical connection with the conductor patterns, and terminal jacks perpendicularly mounted on the module PC board in electrical connection with the conductor patterns. The shielded package has access holes to allow the insertion of the terminal pins of the mother PC board into the terminal jacks of the module circuit assembly.

The present invention is now described in detail based on the preferred embodiments with reference to the accompanying drawings.

DESCRIPTION OF THE PREFERRED EMBODIMENTS

Figure 1:
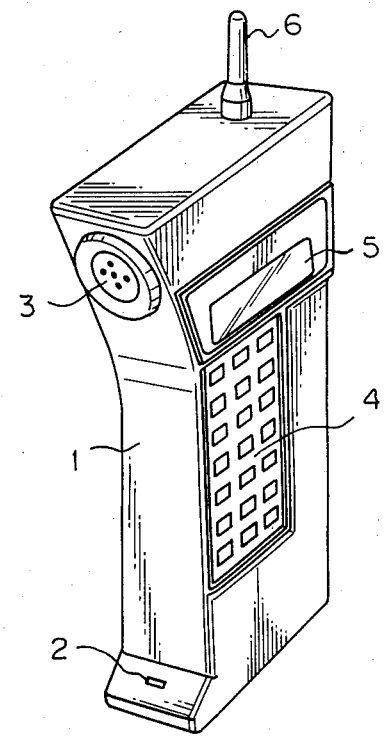
FIG. 1 is an external perspective view of a portable telephone according to an embodiment of the present invention.
Figure 2:
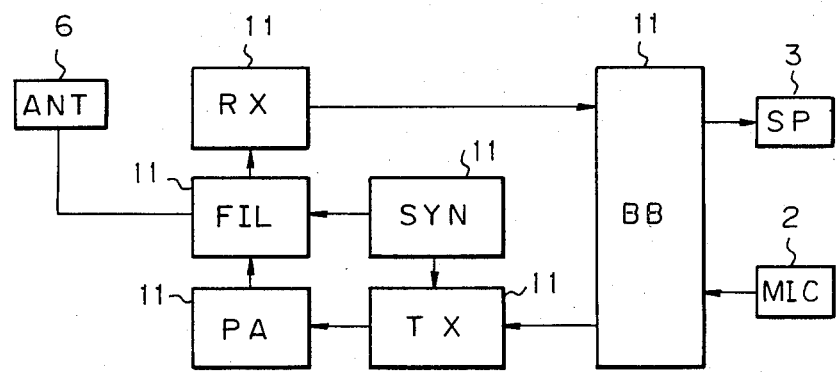
FIG. 2 is a block circuit diagram of the main circuit in the telephone in FIG. 1.

FIG. 1 shows an external view of a portable telephone having an approved operating frequency in a band of, for example, from 400 megahertz to 2 gigahertz. This telephone has a casing 1, a microphone 2, a speaker 3, a keyboard 4, a display 5, an antenna 6, and a battery case (not illustrated), which are assembled into a single unit. The telephone also has electrical circuits, including an RF or high frequency circuit, a power supply circuit, and a control or logic circuit. FIG. 2 illustrates the main circuit of the telephone, which includes an RF circuit consisting of a plurality of RF circuit modules 11, i.e., filter FIL, receiver RX, transmitter TX, baseband circuit BB, synthesizer SYN, and power amplifier PA.

Figure 3:
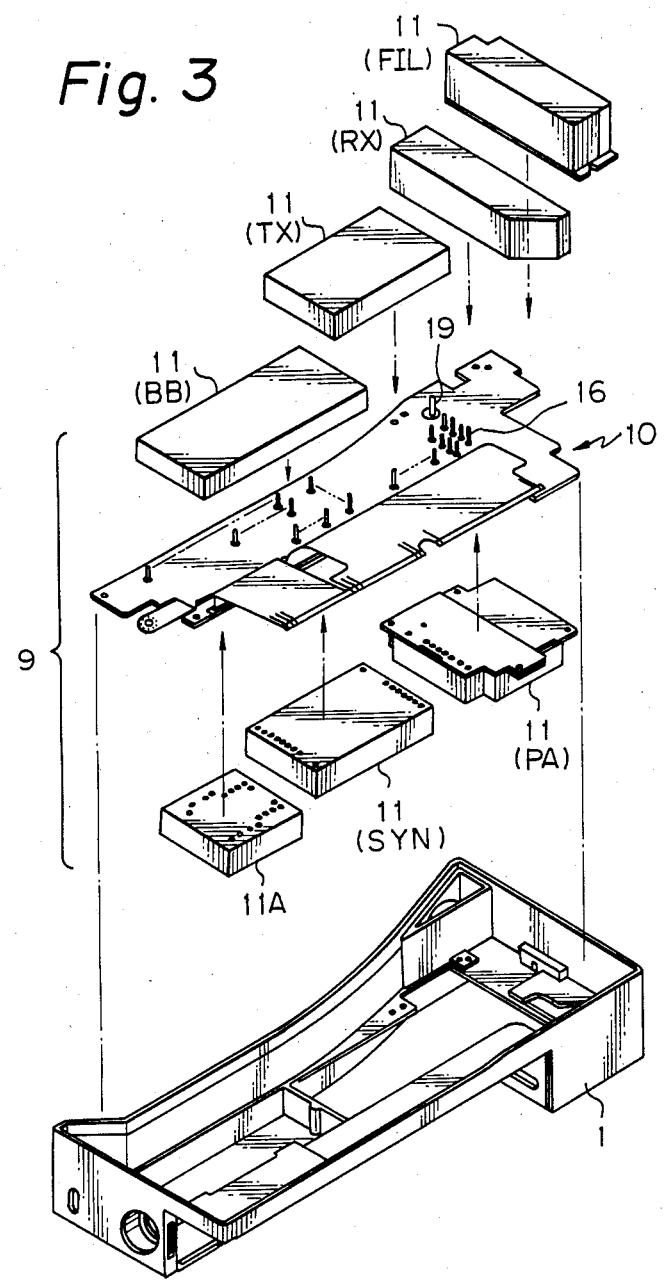
FIG. 3 is a perspective view of the main parts of the telephone in FIG. 1 in a disassembled condition, illustrating a circuit assembly including RF circuit modules.

The electrical circuits of the telephone are constructed into circuit assemblies, which are mounted in the casing 1. One such circuit assembly is illustrated in FIG. 3 in a disassembled condition and generally designated by the reference numeral 9. The circuit assembly 9 comprises a mother PC board 10, on which the RF circuit modules 11 (filter FIL, receiver RX, transmitter TX, baseband circuit BB, synthesizer SYN, and power amplifier PA) and a low frequency circuit module 11A (power supply circuit) are mounted. The low frequency circuit module 11A is not described in detail herein, since it has substantially the same structure as that of the high frequency circuit modules 11.

Figure 4:
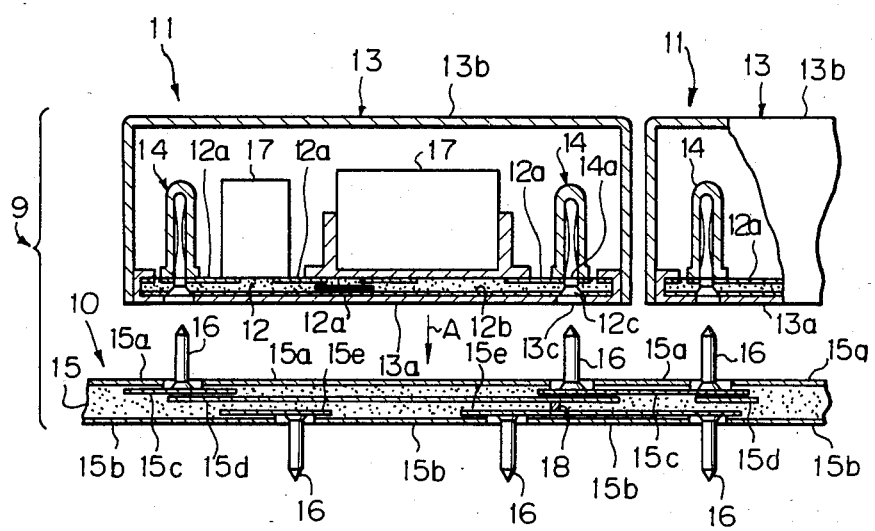
FIG. 4 is a cross sectional view of a part of the circuit assembly in FIG. 3 in a disassembled condition.

Referring to FIG. 4, each of the RF circuit modules 11 comprises a metal shielded package 13, in which a module circuit assembly is mounted. The module circuit assembly comprises a module PC board 12, on which electrical components 17 and terminal jacks 14 are mounted. The PC board 12 is made of dielectric material, for example, ceramics or a resin containing polytetrafluoroethylene, and has conductor patterns 12a, including connecting patterns and distributed constant circuit patterns, on one surface thereof, and a ground layer 12b on the other surface thereof. The electrical components 17 are mounted on one surface of the PC board 12 and soldered to the conductor patterns 12a, thereby forming an electrical circuit having a predetermined function. The terminal jacks 14 are input and output terminals for the signal lines and the power supply lines and are perpendicularly mounted on the PC board 12 in electrical connection with the conductor patterns 12a.

The above-described module circuit assembly, i.e., the PC board 12 with the components 17 and terminal jacks 14 mounted thereon, is securely mounted on a baseplate 13a of the shielded package with the ground layer 12b of the PC board 12 in close contact with the baseplate 13a, and then a cover 13b of the shielded package 13 is securely attached to the baseplate 13a, so that the RF circuit modules 11 are electromagnetically shielded from each other. The baseplate 13b of the shielded package 13 and the PC board 12 have access holes 13c and 12c, respectively, formed therein in alignment with inlets 14a of the terminal jacks 14.

Figure 5:
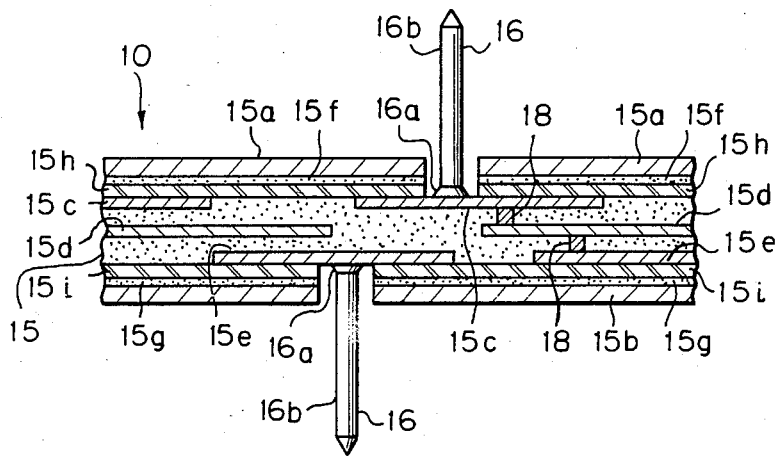
FIG. 5 is an enlarged partial cross sectional view of a mother PC board of the circuit assembly.

Referring to FIGS. 4 and 5, the mother PC board 10 has a baseboard 15, on which terminal pins 16 perpendicularly mounted on both surfaces thereof are in alignment with the terminal jacks 14 of the circuit modules 11 and 11A. The baseboard 15 is made of dielectric material such as described hereinbefore, and has three layers of inner conductor patterns 15c, 15d, and 15e which are electrically interconnected by via-holes 18 according to the circuit design. The baseboard 15 also has ground layers 15a and 15b on both surfaces thereof. These layers 15a and 15b are electrically isolated from the inner conductor patterns 15c and 15e by insulating layers 15h and 15i and adhesives 15f and 15g interposed therebetween. The ground layers 15a and 15b are made of aluminum deposited over the entire surfaces of the baseboard, except for the regions in which the terminal pins 16 and other input and output terminals (not illustrated) are mounted or formed. The baseboard 15 has a thickness of, for example, about 1.5 mm.

The terminal pins 16 are made of phosphor bronze and have a diameter of, for example, about 0.4 mm. The terminal pins 16 have a root portion 16a fixed to the baseboard 15 without projecting from the latter, and a contact portion 16b projecting perpendicularly from the baseboard 15. The root portion 16a is fixedly adhered to the surface of the conductor patterns 15c or 15e by thermocompression with the aid of gold (Au) or tin (Sn); to achieve a high mechanical security and optimum electrical connection with the conductor patterns 15c or 15e. The terminal pins 16 are electrically interconnected via the inner conductor patterns 15c, 15d, and 15e, according to the circuit design.

The circuit modules 11 and 11A are mounted on the mother PC board 10 by pressing the modules 11 and 11A onto the mother PC board as shown by the arrow A in FIG. 4, in such a manner that the contact portions 16b of the terminal pins 16 of the mother PC board inserted in and connected with the terminal jacks 14 of the circuit modules 11 and 11A, and the baseplates 13a of the shielded packages 13 of the circuit modules 11 and 11A are in close contact with the ground layers 15a and 15b of the mother PC board 10. Accordingly, the circuit modules 11 and 11A are electrically connected to each other and to other not-illustrated circuit modules and circuit assemblies, via the mother PC board 10. The RF signal lines, the power supply lines, and the control signal lines of the circuit modules are connected via the terminal pins 16 and the terminal jack 14. Grounding of the circuit modules 11 and 11A is achieved by connecting the ground layers 12a thereof to the ground layers 15a and 15b of the mother PC board via the baseplates 13a of the shielded packages 13. Contact between the shielded packages 13 and the ground layers 15a and 15b of the mother PC board can be ensured by providing the cover (not illustrated) of the casing 1 with elastic members for pressing the circuit modules 11 and 11A toward the mother PC board 10 when the unit is in an assembled condition. To achieve a more reliable grounding of the circuit modules 11 and 11A, the circuit modules 11 and 11A and the mother PC board 10 may be provided with terminal jacks 14 and terminal pins 16, which are connected to the ground layers 12a and 15a or 15b, via the conductor patterns 12a and 15c, 15d, or 15e, respectively.

Figure 6:
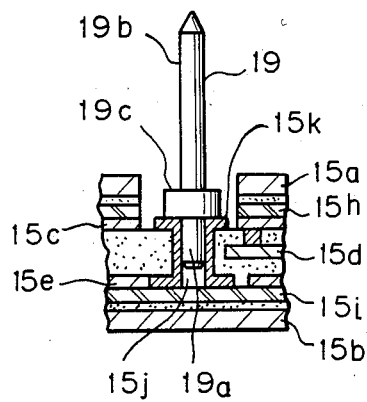
FIG. 6 is a partial cross sectional view of the mother PC board, illustrating another embodiment according to the present invention of a terminal pin thereof.

FIG. 6 illustrates another embodiment according to the present invention of the terminal pin mounted on the mother PC board. A terminal pin 19 has a root portion 19a, a contact portion 19b, and an abutting flange 19c. The baseboard 15 of the mother PC board has a plated hole 15j therein, which hole 15j has a conductor 15k in electrical connection with any one or more of the conductor patterns 15c, 15d, and 15e. One end of the hole 15j is closed by the insulating layer 15i and the ground layer 15b. The root portion 19a of the terminal pin 19 is inserted into the hole 15j and the abutting flange 19c is soldered to the conductor 15k. Thus the terminal pin 19 is fixed to the baseboard 15 in electrical connection with the inner conductor patterns 15c, 15d, and 15e. This construction of the terminal pin 19 can provide a more reliable mechanical securing and electrical connection than that of the terminal pin 16.

Figure 7:
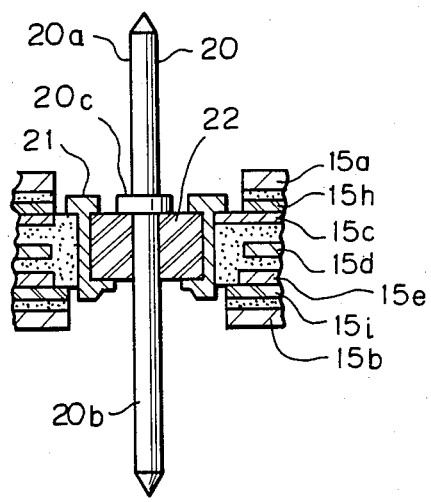
FIG. 7 is a partial cross sectional view of the mother PC board, illustrating a coaxial connector element thereof.

The mother PC board 10 can be provided with a coaxial connector element as shown in FIG. 7. This connector element comprises an inner conductive connector pin 20 and an outer conductive sleeve 21. The sleeve 21 is fixedly embedded in the baseboard 15 of the mother PC board in electrical connection with one or both of the ground layers 15a and 15b, via any one or more of the inner conductor patterns 15c, 15d, and 15e, in the case of the illustrated embodiment. Alternatively, the sleeve 21 may be directly connected to the ground layer 15a. The connector pin 20 is coaxially arranged in and fixed to the sleeve 21, with a dielectric material 22 interposed therebetween, in electrical isolation from both the inner conductor patterns 15c, 15d and 15e and the ground layers 15a and 15b of the baseboard 15. The connector pin 20 has shoulder 20c admitting the dielectric material 22 and opposite contact portions 20a and 20b, which project on opposite sides of the baseboard 15 and to which the terminal jacks of the circuit modules 11 and 11A mounted on opposite sides of the baseboard 15 can be connected. This connector element is used to directly interconnect the circuit modules mounted on opposite sides of the mother PC board, without using the inner conductor patterns.

The above-described structure of the PC board assembly provides the following advantages.

The terminal pins of the mother PC board have no root portion projecting therefrom and, further, the terminal jacks of the circuit modules are enclosed with-in the shielded packages. Furthermore, the mother PC board has ground layers on both surfaces thereof, and accordingly, the circuit assembly with the circuit modules mounted on the mother PC board has no exposed transmitting or connecting lines. This permits electromagnetic interferences between the circuit modules to be avoided, and accordingly, a high density circuit mounting and a high performance characteristic to be achieved.

Further, since the ground layers are formed on both surfaces of the mother PC board, the inner conductor patterns of the mother PC board can be formed into electrical signal transmitting lines having the required impedances. This permits impedance mismatching in the connection of the RF circuit modules to be avoided, thereby permitting a high performance characteristic to be achieved.

Furthermore, since the terminal pins of the mother PC board have no root portion projecting from the baseboard, both surfaces of the mother PC board can be efficiently used for connecting or mounting the circuit modules, and accordingly, a high density circuit mounting can be achieved.

Other advantages are: the circuit modules without projecting terminal pins are conveniently handled during manufacturing, etc.; and the aforesaid terminal pins and jacks permit the circuit modules to be easily mounted and dismounted to the mother PC board.

As described above, according to the present invention, there is provided a radio apparatus, in particular, a mobile radio communication unit having a compact size, a high performance characteristic, and an ease-of-handling during manufacturing and assemblying.

What is claimed is:

1. A printed circuit board for a radio apparatus, comprising:
   a baseboard of dielectric material having inner conductor patterns therein and ground layers on both surfaces thereof; and
   terminal pins fixedly mounted on said baseboard in electrical connection with said inner conductor patterns, each of said terminal pins having a root portion fixed to the baseboard without projecting from the baseboard and a contact portion perpendicularly projecting from the baseboard, wherein said terminal pins are mounted on both surfaces of the baseboard.

2. A printed circuit board according to claim 1, wherein said terminal pins are fixedly connected to said conductor patterns, with the root portions thereof being in abutting engagement with the surfaces of the conductor patterns.

3. A printed circuit board according to claim 1, wherein said baseboard has holes opened at one end, said holes being provided with conductors in electrical connection with said conductor patterns, and wherein said terminal pins are fixedly inserted into said holes in electrical connection with said conductors.

4. A printed circuit board according to claim 1, further comprising at least one coaxial connector element having
   an outer conductive sleeve fixedly embedded in the baseboard in electrical connection with at least one of said ground layers;
   an inner conductive connector pin coaxially disposed in and fixed to said sleeve in electrical isolation from both said conductor patterns and the ground layers of the baseboard, said connector pin having two contact portions perpendicuarly projected on opposite sides of the baseboard; and
   a dielectric material interposed between said sleeve and said connector pin for electrically isolating said connector pin.

5. A circuit assembly for a radio apparatus, comprising:
   (a) a mother printed circuit board including
      (i) a baseboard of dielectric material having inner conductor patterns therein and ground layers on both surfaces thereof, and (ii) terminal pins fixedly mounted on said baseboard in electrical connection with said conductor patterns, each of said terminal pins having a root portion fixed to the baseboard without projecting from the baseboard and a contact portion perpendicularly projecting from the baseboard; and (b) circuit modules mounted on said mother printed circuit board, each of the circuit modules including (i) a module circuit assembly with a module printed circuit board of dielectric material having conductor patterns, electrical components mounted on the module printed circuit board in electrical connection with the conductor patterns, and terminal jacks perpendicularly mounted on the module printed circuit board in electrical connection with the conductor patterns, and (ii) a shielded package enclosing said module circuit assembly for electromagnetic shielding, said package having access holes for insertion of the terminal pins of said mother printed circuit board into the terminal jacks of said module circuit assembly, wherein the module printed circuit board of said module circuit assembly has a ground layer on the back surface thereof opposite to the surface on which the electrical components and the terminal jacks are mounted, said ground layer of the module printed circuit board being in contact with said shielded package, wherein said shielded packages of the circuit modules are in contact with at least one of said ground layers of the mother printed circuit board, whereby the module circuit assemblies are electrically grounded to the ground layer of the mother printed circuit board, via the shielded packages, and wherein said circuit modules are mounted on the mother printed circuit board, with the contact portions of the terminal pins of the mother printed circuit board being connected therewith by insertion in the terminal jacks of the circuit modules.

6. A circuit assembly according to claim 5, wherein said mother printed circuit board is provided with said terminal pins on one surface thereof, and said circuit modules are mounted on said one surface of the mother printed circuit board.

7. A circuit assembly according to claim 5, wherein said mother printed circuit board is provided with said terminal pins on both surfaces thereof, and said circuit modules are mounted on both surfaces of the mother printed circuit board.

8. A circuit assembly according to claim 5, wherein said mother printed circuit board further comprises at least one coaxial connector element having an outer conductive sleeve fixedly embedded in the baseboard of the mother printed circuit board in electrical connection with at least one of said ground layers of the mother printed circuit board, an inner conductive connector pin coaxially disposed in and fixed to said sleeve in electrical isolation from both the conductor patterns and the ground layers of the baseboard of the mother printed circuit board, said connector pin having two contact portions perpendicularly projecting on opposite sides of the baseboard of the mother printed circuit board, and a dielectric material interposed between said sleeve and said connector pin for electrically isolating said connector pin; and wherein said circuit modules are mounted on both surfaces of the mother printed circuit board, and any one of the circuit modules mounted on one surface of the mother printed circuit board is electrically connected to the corresponding circuit module mounted on the other surface of the mother printed circuit board, via said coaxial connector element, with the contact portion of the connector pin being connected into the terminal jacks of said circuit modules.

* * * * *